(12) United States Patent
Su et al.

(10) Patent No.: US 8,941,959 B2
(45) Date of Patent: Jan. 27, 2015

(54) ESD PROTECTION APPARATUS

(71) Applicant: Taiwan Semiconductor Manufacturing Company, Ltd., Hsin-Chu (TW)

(72) Inventors: Yu-Ti Su, Tainan (TW); Shu-Ming Cheng, Chu-bai (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 91 days.

(21) Appl. No.: 13/712,367

(22) Filed: Dec. 12, 2012

(65) Prior Publication Data

US 2014/0160606 A1    Jun. 12, 2014

(51) Int. Cl.
*H02H 9/00* (2006.01)
*H02H 9/04* (2006.01)

(52) U.S. Cl.
CPC ........................................ *H02H 9/04* (2013.01)
USPC ............................................................ 361/56

(58) Field of Classification Search
CPC ........................................................ H02H 9/046
USPC ............................................................ 361/56
See application file for complete search history.

(56) References Cited

U.S. PATENT DOCUMENTS

| | | | | |
|---|---|---|---|---|
| 5,041,889 | A | * | 8/1991 | Kriedt et al. ................... 257/362 |
| 5,821,797 | A | * | 10/1998 | Kinugasa et al. ............. 327/318 |
| 5,874,858 | A | * | 2/1999 | Furuya ........................... 330/273 |
| 8,649,135 | B2 | * | 2/2014 | Ker et al. ........................ 361/56 |

* cited by examiner

*Primary Examiner* — Rexford Barnie
*Assistant Examiner* — Tien Mai
(74) *Attorney, Agent, or Firm* — Slater & Matsil, L.L.P.

(57) ABSTRACT

An electrostatic discharge (ESD) protection structure comprises a first NPN transistor and a second NPN transistor connected in parallel. The bases of the first NPN transistor and the second NPN transistor are coupled together and further coupled to a first voltage potential and a second voltage potential through two deep trench capacitors respectively. The ESD protection structure further comprises a third deep trench capacitor and a fourth deep trench capacitor coupled between the first voltage potential and the second voltage potential.

20 Claims, 4 Drawing Sheets

ESD PROTECTION APPARATUS

BACKGROUND

Electrostatic Discharge (ESD) is a rapid discharge that flows between two objects due to the built-up of static charge. ESD may destroy semiconductor devices because the rapid discharge can produce a relatively large current. Electrostatic discharge ("ESD") protection structures are needed for integrated circuits. In ESD protection, an ESD circuit is formed near integrated circuit terminals such as input and output pads, and also for power supply terminals. ESD protection circuits may provide a current discharge path so as to reduce the semiconductor failures due to ESD.

In the semiconductor technology, ESD protection devices are generally integrated into integrated circuits. NMOS transistors, Silicon-Controlled Rectifiers (SCRs) and resistor-capacitor (RC) triggered PMOS transistors and/or the like are widely used as ESD protection devices.

SCRs may be conveniently formed by forming parasitic transistors in doped well regions adjacent a terminal, are often used for ESD structures. An SCR can be designed to turn on in response to a voltage applied to the SCR and over a threshold. The turned on SCR may provide a discharge path and then safely conduct ESD stress current through the discharge path. As a result, the internal circuitry coupled to a pad terminal may be protected.

An NPN transistor may be used for ESD protection. The source region of the NPN transistor is typically coupled to a power supply VSS, which is typically grounded. The drain region of the NPN transistor may be coupled to an integrated circuit to be protected. If an electrostatic transient occurs across the drain region and the source region, the NPN transistor is turned on and the ESD current flows from the drain region to the source region, so that the integrated circuit coupled to the drain region is protected.

As semiconductor technologies evolve, advance of submicron semiconductor processes may further reduce the physical size of a semiconductor chip. However, the existing ESD protection mechanisms may not meet the ever-increasing requirements from the semiconductor industry. For example, a RC triggered ESD protection solution may consume a large die area.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, an electrostatic discharge (ESD) protection device formed by two NPN transistors and a plurality of deep trench capacitors (DTC). The invention may also be applied, however, to a variety of ESD protection devices. Hereinafter, various embodiments will be explained in detail with reference to the accompanying drawings.

Figure 1:
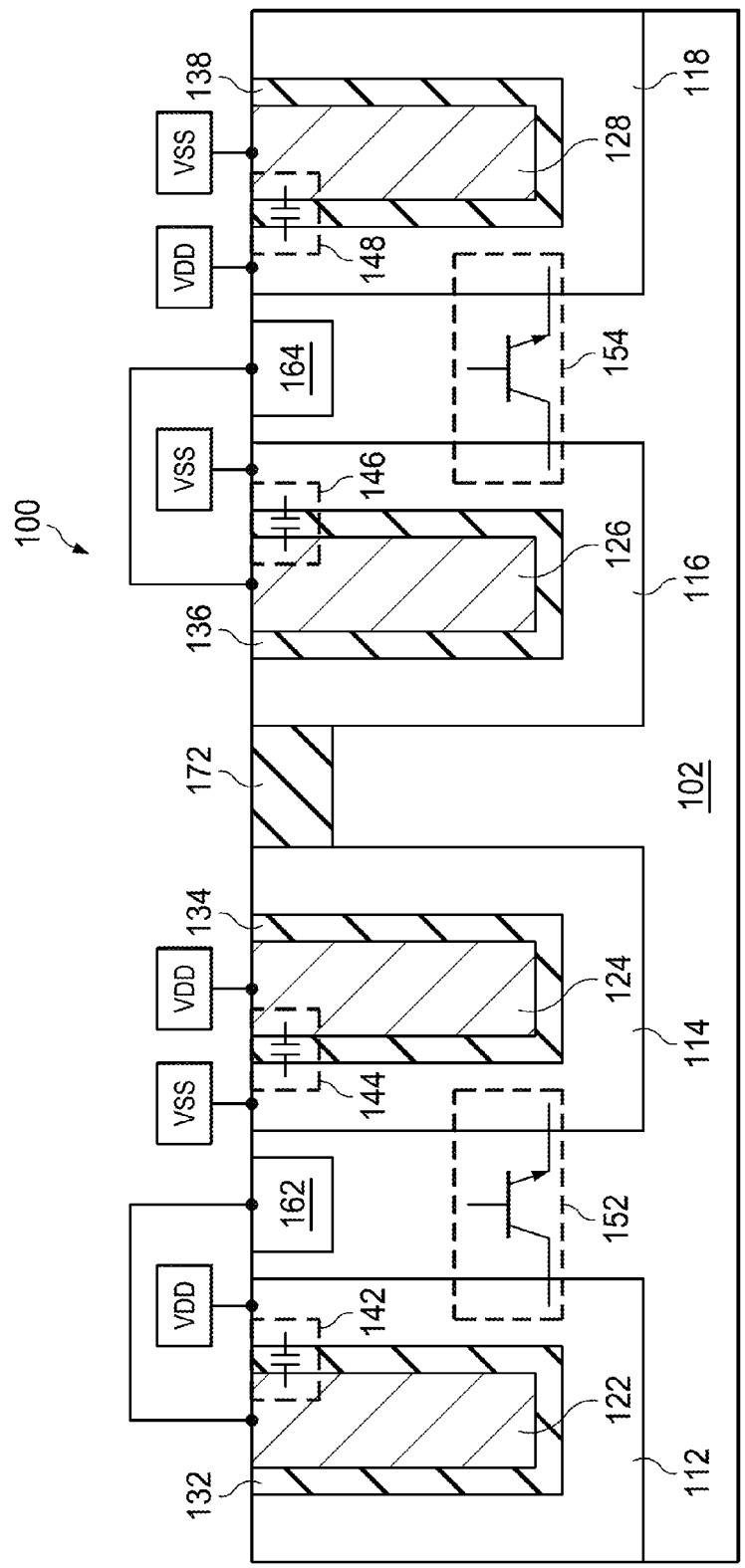
FIG. 1 illustrates a simplified cross-sectional view of an ESD protection structure in accordance with an embodiment.

FIG. 1 illustrates a simplified cross-sectional view of an ESD protection structure in accordance with an embodiment. The ESD protection structure 100 includes four semiconductor regions 112, 114, 116 and 118 formed in a substrate 102. Furthermore, four conductive regions 122, 124, 126 and 128 are formed in the semiconductor regions 112, 114, 116 and 118 respectively. As shown in FIG. 1, there may be an isolation layer (e.g., isolation layer 132) formed between a conductive region (e.g., conductive region 122) and its corresponding semiconductor region (e.g., semiconductor region 112).

The substrate 102 may be formed of silicon, although it may also be formed of other group III, group IV, and/or group V elements, such as silicon, germanium, gallium, arsenic, and combinations thereof. The substrate 102 may also be in the form of silicon-on-insulator (SOI). The SOI substrate may comprise a layer of a semiconductor material (e.g., silicon, germanium and/or the like) formed over an insulator layer (e.g., buried oxide or the like), which is formed in a silicon substrate. In addition, other substrates that may be used include multi-layered substrates, gradient substrates, hybrid orientation substrates and/or the like.

The substrate 102 may further comprise a variety of electrical circuits (not shown). The electrical circuits formed on the substrate 102 may be any type of circuitry suitable for a particular application. In accordance with an embodiment, the electrical circuits may include various n-type metal-oxide semiconductor (NMOS) and/or p-type metal-oxide semiconductor (PMOS) devices such as transistors, capacitors, resistors, diodes, photo-diodes, fuses and/or the like. The electrical circuits may be interconnected to perform one or more functions. The functions may include memory structures, processing structures, sensors, amplifiers, power distribution, input/output circuitry and/or the like. One of ordinary skill in the art will appreciate that the above examples are provided for illustrative purposes only and are not intended to limit the various embodiments to any particular applications.

Depending on different applications, the substrate 102 may be formed of either n-type dopants or p-type dopants. In accordance with an embodiment, the substrate 102 is a p-type substrate. The doping density of the substrate 102 is in a range from about $10^{14}/cm^3$ to about $10^{16}/cm^3$.

The semiconductor regions 112, 114, 116 and 118 are either n-type regions or p-type regions formed in the substrate 102. In an embodiment in which the substrate 102 is a p-type substrate, the semiconductor regions 112, 114, 116 and 118 may be formed by implanting appropriate n-type dopants such as phosphorus, arsenic and/or the like. Alternatively, in an embodiment in which the substrate 102 is an n-type substrate, the semiconductor regions 112, 114, 116 and 118 may be formed by implanting appropriate p-type dopants such as boron, gallium, indium and/or the like.

In accordance with an embodiment, the semiconductor regions 112, 114, 116 and 118 are highly doped n-type regions. The semiconductor regions 112, 114, 116 and 118 may be of a doping density in a range from about $10^{17}/cm^3$ to about $10^{19}/cm^3$.

It should be noted that the doping technique used in the previous example is selected purely for demonstration purposes and is not intended to limit the various embodiments to any particular doping technique. One skilled in the art will recognize that alternate embodiment could be employed (such as employing the diffusion technique).

It should further be noted that while the four semiconductor regions (e.g., semiconductor regions 112, 114, 116 and 118) appear to be similar in FIG. 1, one person skilled in the art will recognize that it is merely an example. The four semiconductor regions may have unequal dimensions or doping concentrations.

The ESD protection structure 100 may comprise two implanted regions 162 and 164 formed in the substrate 102. As shown in FIG. 1, the first implanted region 162 is formed between the first semiconductor region 112 and the second semiconductor region 114. The second implanted region 164 is formed between the third semiconductor region 116 and the fourth semiconductor region 118.

The implanted regions 162 and 164 may be formed by implanting doping materials into the substrate. In an embodiment in which the substrate 102 is an n-type substrate, the implanted regions 162 and 164 may be formed by implanting appropriate n-type dopants such as phosphorus, arsenic and/or the like. Alternatively, in an embodiment in which the substrate 102 is a p-type substrate, the implanted regions 162 and 164 may be formed by implanting appropriate p-type dopants such as boron, gallium, indium and/or the like. As shown in FIG. 1, phosphor may be implanted to form p-type implanted regions 162 and 164 with a doping density in a range from about $10^{15}/cm^3$ to about $10^{16}/cm^3$.

The ESD protection structure 100 may comprise four conductive regions 122, 124, 126 and 128 formed in the semiconductor regions 112, 114, 116 and 118 respectively. In accordance with an embodiment, the conductive regions may be formed of polysilicon, although other suitable materials such as copper, aluminum, alloys, tungsten, silver, combinations thereof, and/or the like, may alternatively be utilized.

As shown in FIG. 1, each conductive region (e.g., conductive region 122) is separated from its corresponding semiconductor region (e.g., semiconductor region 112) by a dielectric layer (e.g., dielectric layer 132). In accordance with an embodiment, the dielectric layers 132, 134, 136 and 138 are formed of suitable dielectric materials such as oxide and/or the like.

As shown in FIG. 1, there may be four deep trench capacitors formed in the ESD protection structure 100. A first deep trench capacitor 142 is formed between the first conductive region 122 and the first semiconductor region 112. Likewise, a second deep trench capacitor 144 is formed between the second conductive region 124 and the second semiconductor region 114. A third deep trench capacitor 146 is formed between the third conductive region 126 and the third semiconductor region 116. A fourth deep trench capacitor 148 is formed between the fourth conductive region 128 and the fourth semiconductor region 118.

In addition, there may be two NPN transistors 152 and 154 formed in the ESD protection structure 100. As shown in FIG. 1, a first NPN transistor 152 is formed between the first semiconductor region 112 and the second semiconductor region 114. More particularly, the collector of the first transistor 152 is formed in the first semiconductor region 112 and coupled to a first voltage potential VDD. The emitter of the first transistor 152 is formed in the second semiconductor region 114 and coupled to a second voltage potential VSS. The base of the first transistor 152 is formed in the substrate 102 and coupled to the first conductive region 122 through the first implanted region 162.

Likewise, a second NPN transistor 154 is formed between the third semiconductor region 116 and the fourth semiconductor region 118. More particularly, the emitter of the second transistor 154 is formed in the fourth semiconductor region 118 and coupled to the first voltage potential VDD. The collector of the second transistor 154 is formed in the third semiconductor region 116 and coupled to the second voltage potential VSS. The base of the second transistor 154 is formed in the substrate 102 and coupled to the third conductive region 126 through the second implanted region 164.

It should be noted that the first voltage potential VDD is tied to a power supply rail in accordance with an embodiment. The second voltage potential VSS is tied to ground. The first implanted region 162 and the second implanted region 164 are employed to reduce the contact resistance of the NPN transistors 152 and 154. The ESD protection structure 100 may function correctly even if the first implanted region 162 and the second implanted region 164 are not disposed in the substrate 102.

The ESD protection structure 100 may further comprise an isolation region 172 formed between the second semiconductor region 114 and the third semiconductor region 116. The isolation region 172 is used to isolate active regions so as to prevent leakage current from flowing between adjacent active regions. The isolation region (e.g., isolation region 172) can be formed by various ways (e.g., thermally grown, deposited) and materials (e.g., silicon oxide, silicon nitride). In this embodiment, the isolation region 172 may be fabricated by a shallow trench isolation (STI) technique.

One skilled in the art will recognize that FIG. 1 illustrates an ideal profile as doped. The shape of each semiconductor region may vary after subsequent diffusion processes. The shapes of semiconductor regions shown in FIG. 1 are used to illustrate the inventive aspects of the various embodiments.

In order to establish a discharge path between the first voltage potential VDD and the second voltage potential VSS, the semiconductor regions (e.g., semiconductor region 112) and conductive regions (e.g., conductive region 122) are coupled to the first voltage potential VDD and the second voltage potential VSS through a plurality of interconnects (not shown) formed over the substrate 102.

As shown in FIG. 1, the first semiconductor region 112 and the fourth semiconductor region 118 are coupled to VDD. The second semiconductor region 114 and the third semiconductor region 116 are coupled to VSS. The first conductive region 122 is coupled to the first implanted region 162. The third conductive region 126 is coupled to the second implanted region 164. The second conductive region 124 and the fourth conductive region 128 are coupled to VDD and VSS respectively. The detailed equivalent circuit will be described below with respect to FIG. 2.

It should be noted that while FIG. 1 illustrates an ESD protection device based upon two NPN transistors, the cross sectional view shown in FIG. 1 is merely an example, which should not unduly limit the scope of the claims. One of ordinary skill in the art would recognize many variations, alternatives, and modifications. For example, each n-type region in FIG. 1 can be replaced by its corresponding p-type region. Likewise, each p-type region shown in FIG. 1 can be replaced by its corresponding n-type region. As a result, an ESD protection device based upon two PNN transistors is formed. Furthermore, the ESD protection device may be formed by two metal oxide semiconductor (MOS) transistors rather than two bipolar transistors.

Figure 2:
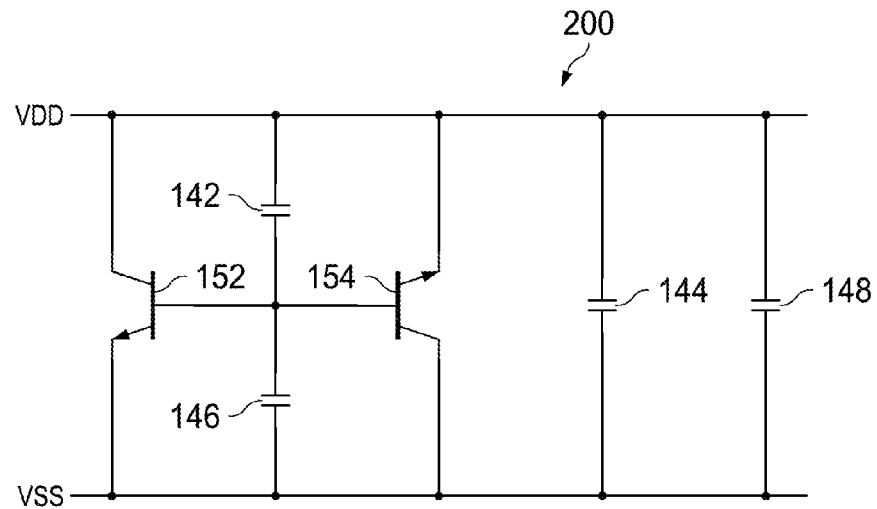
FIG. 2 illustrates an equivalent circuit diagram of the ESD protection structure illustrated in FIG. 1 in accordance with an embodiment.

FIG. 2 illustrates an equivalent circuit diagram of the ESD protection structure 100 illustrated in FIG. 1 in accordance with an embodiment. An equivalent circuit 200 of the ESD protection structure 100 illustrated in FIG. 1 includes a first NPN transistor 152 and a second NPN transistor 154 connected in parallel and coupled between a first voltage potential VDD and a second voltage potential VSS. Referring back to FIG. 1, the collector and emitter of the first NPN transistor 152 are formed by the first semiconductor region 112 and the second semiconductor region 114 respectively. The base of the first NPN transistor 152 is formed by the substrate 102. Likewise, the collector and emitter of the second NPN transistor 154 are formed by the third semiconductor region 116 and the fourth semiconductor region 118 respectively. The base of the second NPN transistor 154 is formed by the substrate 102 and coupled to the base of the first NPN transistor 152.

As shown in FIG. 2, the four deep trench capacitors 142, 144, 146 and 148 are part of the ESD protection structure 100. More particularly, the deep trench capacitor 142 is coupled between the bases of the NPN transistors 152 and 154, and the first voltage potential VDD. The deep trench capacitor 146 is coupled between the bases of the NPN transistors 152 and 154, and the second voltage potentials VSS. The deep trench capacitors 144 and 148 are coupled between VDD and VSS.

The deep trench capacitors 142 and 146 may provide a bi-directional coupling during an ESD event. More particularly, when a voltage spike is applied to VDD, the deep trench capacitor 142 helps to couple the voltage spike to the bases of the NPN transistors 152 and 154. As such, the trigger voltage in response to an ESD event may be reduced accordingly. On the other hand, when a voltage spike is applied to VSS, the deep trench capacitor 146 helps to couple the voltage spike to the bases of the NPN transistors 152 and 154.

It should be noted that while the deep trench capacitors 142 and 146 are employed to provide a coupling between a voltage spike and the bases of the NPN transistors 152 and 154, during normal operation, the deep trench capacitors 142 and 146 may function as a decoupling capacitor for an integrated circuit coupled between the voltage potentials VDD and VSS. Such a decoupling capacitor can help to stabilize the voltages at VDD and VSS.

It should be recognized that while FIG. 2 illustrates the ESD protection circuit 200 with two NPN transistors (e.g., NPN transistors 152 and 154), the ESD protection circuit could accommodate any numbers of NPN transistors. Furthermore, it is understood that the ESD protection circuit may be implemented using a plurality of NPN transistors in series connection. On the other hand, other configurations of a plurality of NPN transistors such as parallel-connected NPN transistors coupled to parallel-connected NPN transistors are also within the contemplated scope of this embodiment.

The ESD protection circuit 200 is typically placed at an I/O pad and a VSS of a device to be protected (not shown but illustrated in FIGS. 3-6). More particularly, the collectors of the NPN transistors 152 and 154 are typically coupled to the I/O pad and the emitters of the NPN transistors 152 and 154 are typically coupled to the VSS, which is typically grounded or coupled to a power supply.

During an ESD event, a voltage spike is applied between the first voltage potential terminal (e.g., VDD) and the second voltage terminal (e.g., VSS). Consequently, the NPN transistors 152 and 154 may experience the voltage spike, which may exceed the breakdown voltage of the NPN transistors 152 and 154. In addition, the voltage spike may be coupled to the bases of the NPN transistors 152 and 154 through either the capacitor 142 or the capacitor 146. It should be noted the capacitors 142 and 146 may function as coupling capacitors. In particular, when a positive spike occurs, a portion of the voltage spike may be applied to the bases of the NPN transistors 152 and 154 through the coupling effect provided by the capacitor 142. Likewise, when a negative spike occurs, a portion of the voltage spike may be applied to the bases of the NPN transistors 152 and 154 through the coupling effect provided by the capacitor 146. The voltage spike applied to the bases of the NPN transistors 152 and 154 helps to turn on the NPN transistors 152 and 154 during an ESD event.

Furthermore, during the ESD event, the NPN transistors 152 and 154 may enter an avalanche conduction mode. As a consequence of the avalanche conduction, the NPN transistors 152 and 154 may provide a current path so that the ESD discharge current can flow from the collectors to the emitters. The conduction of the NPN transistors 152 and 154 clamps the voltage between the first voltage potential terminal VDD and the second voltage potential terminal VSS to a lower level so that the internal circuits coupled between VDD and VSS can be protected accordingly.

One advantageous feature of having the ESD structure shown in FIG. 2 is that the ESD structure is formed by parasitic transistors and deep trench capacitors. For applications such as low dropout (LDO) regulators, deep trench capacitors are required to stabilize the output voltage of the LDO. Parasitic transistors may exist when deep trench capacitors are formed as shown in FIG. 1. By utilizing the parasitic transistors and deep trench capacitors, an ESD protection structure may be formed. Such an ESD protection structure can effectively reduce ESD failures without adding extra fabrication masks. In addition, the die area occupied by the ESD protection structure is minimal because parasitic transistors are employed to form the ESD protection structure.

Figure 3:
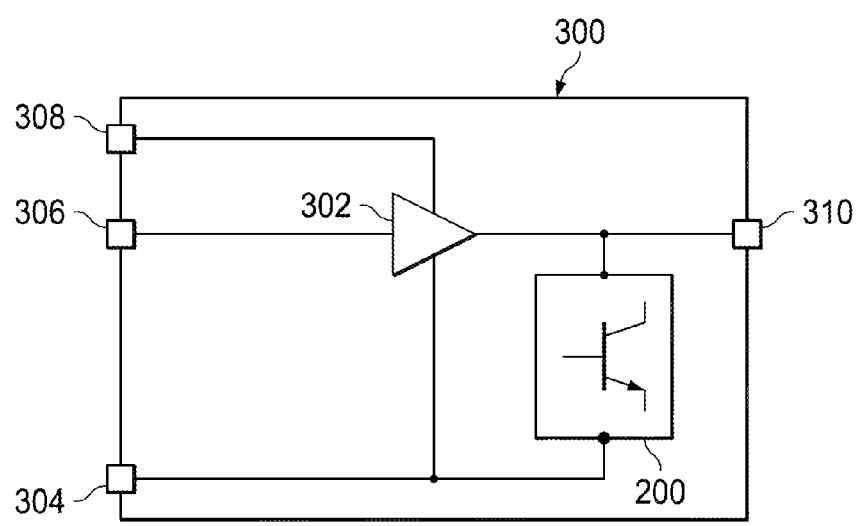
FIG. 3 illustrates an integrated circuit level ESD protection diagram in accordance with an embodiment.

FIG. 3 illustrates an integrated circuit level ESD protection diagram in accordance with an embodiment. An integrated circuit chip 300 has a VDD pad 308, a first I/O pad 306, a second I/O pad 310 and a VSS pad 304. Internal circuits 302 are coupled to the VDD pad 308 and VSS pad 304. The internal circuits 302 further include an input coupled to the first I/O pad 306 and an output coupled to the second I/O pad 310. In accordance with an embodiment, the integrated circuit chip 300 may be a low dropout (LDO) regulator.

The ESD protection circuit 200 is coupled between the second I/O pad 310 and the VSS pad 304. When an ESD event occurs between the second I/O pad 310 and the VSS pad 304, the ESD protection circuit 200 conducts the ESD current, and the turn-on of an ESD protection circuit (e.g., the ESD protection circuit 200) clamps the voltage between the second I/O pad 310 and the VSS pad 304 below the maximum voltage to which the internal circuits 302 are specified, so that the internal circuits 302 coupled between the second I/O pad 310 and the VSS pad 304 are protected. An advantageous feature of the described circuit level ESD protection is the ESD protection circuit provides a bypass for ESD current to flow so that the various circuit components of the internal circuit 302 are protected.

Figure 4:
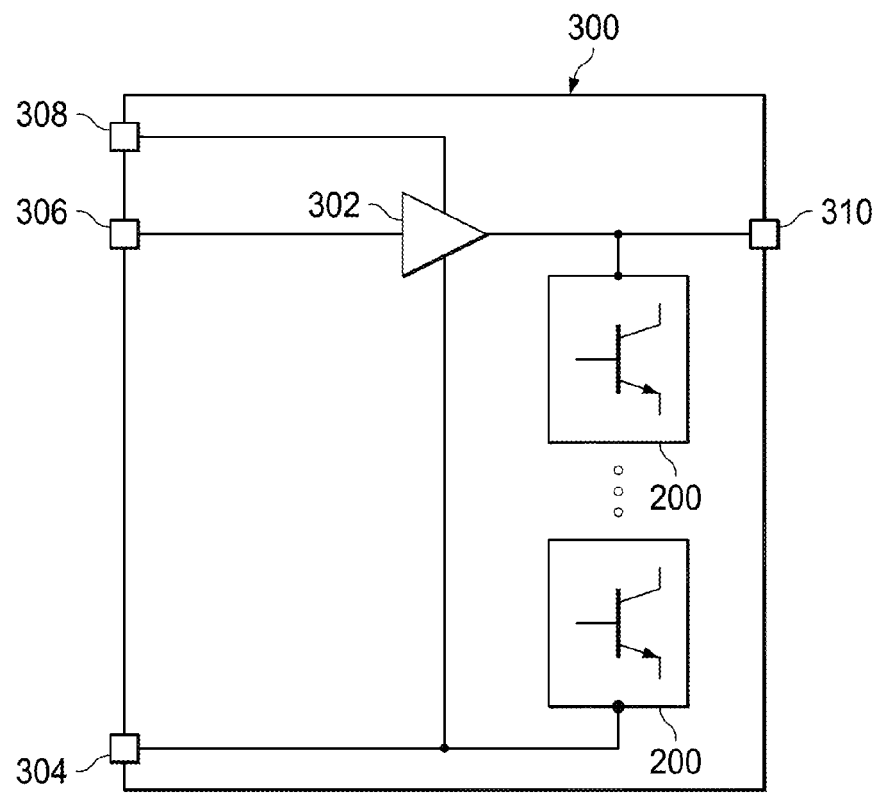
FIG. 4 illustrates a further ESD protection scheme by employing a plurality of ESD protection circuits in series connection between an I/O pad and a VSS pad in accordance with an embodiment.

FIG. 4 illustrates a further ESD protection scheme by employing a plurality of ESD protection circuits in series connection between an I/O pad and a VSS pad in accordance with an embodiment. Similar to FIG. 3, FIG. 4 includes an integrated circuit 302, a VDD pad 308, a first I/O pad 306, a second I/O pad 310 a VSS pad 304 and internal circuits 302. However, FIG. 4 further includes a series connection of ESD protection circuits electrically coupled to the second I/O pad 310 and the VSS pad 304.

In high voltage applications, a single ESD protection circuit such as the ESD protection circuit 200 shown in FIG. 3 may not provide a reliable ESD protection. By contrast, a plurality of ESD protection circuits 200 connected in series may provide a reliable protection breakdown voltage. As shown in FIG. 4, the ESD protection circuits 200 connected in series are substantially identical. It should be noted that "substantially identical" means the same design but could be different from each other due to fabrication process variations.

In FIG. 4, if an ESD event occurs, a voltage spike is applied between the second I/O pad 310 and the VSS pad 304. The series-connected ESD protection circuits may turn on nearly simultaneously. Each ESD protection circuit provides an ESD protection breakdown voltage. The sum of all series-connected ESD protection circuits' breakdown voltages clamps the second I/O pad's voltage 310 to a level below the maximum rating voltage of the internal circuits 302, so that the internal circuits 302 are protected.

Figure 5:
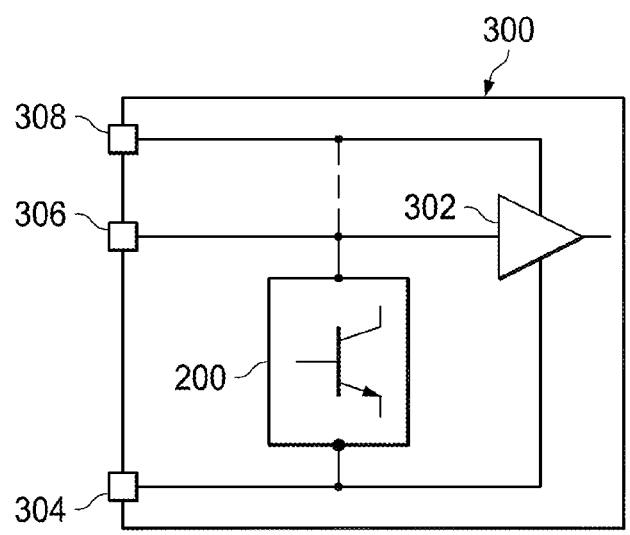
FIG. 5 illustrates an integrated circuit level ESD protection diagram in accordance with another embodiment.

FIG. 5 illustrates an integrated circuit level ESD protection diagram in accordance with another embodiment. The circuit diagram shown in FIG. 5 is similar to that shown in FIG. 3 except that the ESD protection structure 200 is coupled between the first I/O pad 306 and the VSS pad 304. The ESD protection mechanism of FIG. 5 similar to that of FIG. 3, and hence is not discussed herein to avoid repetition.

It should be noted that the ESD protection circuit 200 may be coupled between the VDD pad 308 and the VSS pad 304 as indicated by the dashed line in FIG. 5. When an ESD event occurs between the VDD pad 308 and the VSS pad 304, the conduction of the ESD protection circuit clamps the voltage between the VDD pad 308 and the VSS pad 304, so that the internal circuits such as internal circuits 302 are protected. In short, the connection of the ESD device 200 in FIG. 5 is merely an example, which should not unduly limit the scope of the claims. One skilled in the art will recognize many variations, alternatives, and modifications. For example, the ESD protection circuit 200 may comprise a plurality of NPN transistors connected in series.

Figure 6:
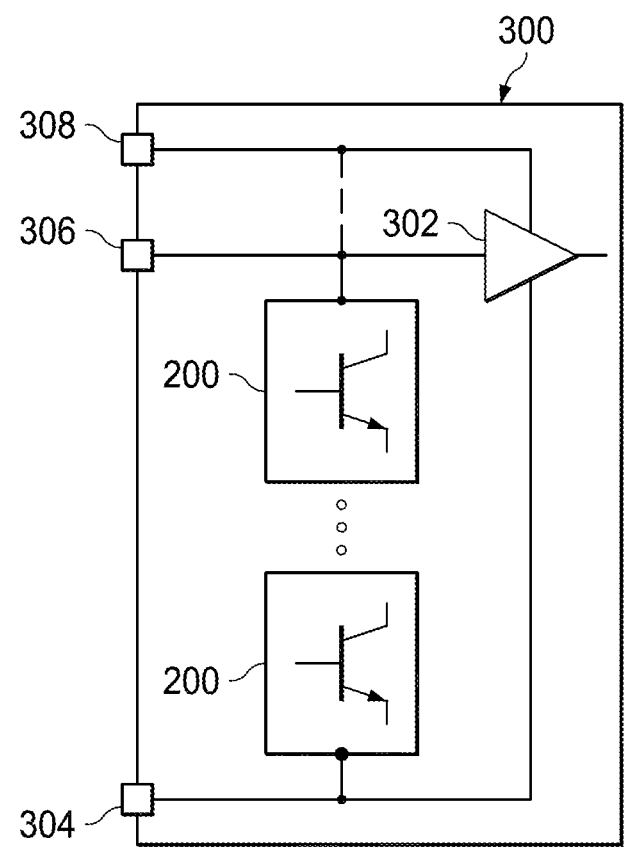
FIG. 6 illustrates an integrated circuit level ESD protection diagram in accordance with yet another embodiment.

FIG. 6 illustrates an integrated circuit level ESD protection diagram in accordance with yet another embodiment. The circuit diagram shown in FIG. 6 is similar to that shown in FIG. 4 except that a plurality of ESD protection structures 200 are connected in series and coupled between the first I/O pad 306 and the VSS pad 304. The ESD protection mechanism of FIG. 6 similar to that of FIG. 4, and hence is not discussed herein to avoid unnecessary repetition.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A device comprising:
a first NPN transistor comprising:
  a first collector formed in a first semiconductor region;
  a first emitter formed in a second semiconductor region; and
  a first base formed in a substrate and coupled to a first capacitor and a second capacitor, wherein:
    the first capacitor is coupled between the base and a first voltage potential; and
    the second capacitor is coupled between the base and a second voltage potential;
a second NPN transistor comprising:
  a second collector formed in a third semiconductor region;
  a second emitter formed in a fourth semiconductor region; and
  a second base formed in the substrate and directly connected to the first base;
a third capacitor coupled between the first voltage potential and the second voltage potential; and
a fourth capacitor coupled between the first voltage potential and the second voltage potential.

2. The device of claim 1, wherein:
the substrate is p-type;
the first semiconductor region is n-type;
the second semiconductor region is n-type;
the third semiconductor region is n-type; and
the fourth semiconductor region is n-type.

3. The device of claim 1, wherein:
the first voltage potential is VDD coupled to a power supply; and
the second voltage potential is VSS coupled to ground.

4. The device of claim 1, wherein:
the first semiconductor region is coupled to the first voltage potential;
the second semiconductor region is coupled to the second voltage potential;
the third semiconductor region is coupled to the second voltage potential; and
the fourth semiconductor region is coupled to the first voltage potential.

5. The device of claim 1, further comprising:
a first conductive region formed in the first semiconductor region, wherein the first conductive region and the first semiconductor region is separated by a first dielectric layer;
a second conductive region formed in the second semiconductor region, wherein the second conductive region and the second semiconductor region is separated by a second dielectric layer;
a third conductive region formed in the third semiconductor region, wherein the third conductive region and the third semiconductor region is separated by a third dielectric layer; and
a fourth conductive region formed in the fourth semiconductor region, wherein the fourth conductive region and the fourth semiconductor region is separated by a fourth dielectric layer.

6. The device of claim 5, wherein:
the first conductive region, the second conductive region, the third conductive region and the fourth conductive region are formed of polysilicon; and
the first dielectric layer, the second dielectric layer, the third dielectric layer and the fourth dielectric layer are formed of oxide.

7. The device of claim 5, wherein:
the first capacitor is formed between the first conductive region and the first semiconductor region;
the second capacitor is formed between the second conductive region and the second semiconductor region;
the third capacitor is formed between the third conductive region and the third semiconductor region; and
the fourth capacitor is formed between the fourth conductive region and the fourth semiconductor region.

8. The device of claim 5, wherein:
the first conductive region is coupled to the first base;
the second conductive region is coupled to the first voltage potential;
the third conductive region is coupled to the second base; and
the fourth conductive region is coupled to the second voltage potential.

9. An Apparatus comprising:
a first semiconductor region formed in a substrate, wherein a first conductive region is embedded in the first semiconductor region and a first dielectric layer is formed between the first conductive region and the first semiconductor region;
a second semiconductor region formed in the substrate, wherein a second conductive region is embedded in the second semiconductor region and a second dielectric layer is formed between the second conductive region and the second semiconductor region, and wherein the second semiconductor region is disposed adjacent to the first semiconductor region and a first implanted region is formed between the first semiconductor region and the second semiconductor region;
a third semiconductor region formed in the substrate, wherein a third conductive region is embedded in the third semiconductor region and a third dielectric layer is formed between the third conductive region and the third semiconductor region; and
a fourth semiconductor region formed in the substrate, wherein a fourth conductive region is embedded in the fourth semiconductor region and a fourth dielectric layer is formed between the fourth conductive region and the fourth semiconductor region, and wherein the fourth semiconductor region is disposed adjacent to the third semiconductor region and a second implanted region is formed between the third semiconductor region and the fourth semiconductor region.

10. The apparatus of claim 9, wherein:
the second semiconductor region is separated from the third semiconductor region by an isolation region.

11. The apparatus of claim 9, wherein:
the substrate is p-type;
the first semiconductor region, the second semiconductor region, the third semiconductor region and the fourth semiconductor region are n-type; and
the first implanted region and the second implanted region are p-type.

12. The apparatus of claim 9, further comprising:
a first transistor having:
a first collector formed in the first semiconductor region;
a first emitter formed in the second semiconductor region; and
a first base formed in the substrate and coupled to a first capacitor and a second capacitor, wherein:
the first capacitor is coupled between the base and a first voltage potential; and
the second capacitor is coupled between the base and a second voltage potential; and
a second transistor connected in parallel with the first transistor, wherein the second transistor comprises:
a second collector formed in the third semiconductor region;
a second emitter formed in the fourth semiconductor region; and
a second base formed in the substrate and coupled to the first base.

13. The apparatus of claim 12, wherein:
the first conductive region is coupled to the first base;
the second conductive region is coupled to the first voltage potential;
the third conductive region is coupled to the second base; and
the fourth conductive region is coupled to the second voltage potential.

14. The apparatus of claim 12, further comprising:
a third capacitor coupled between the first voltage potential and the second voltage potential; and
a fourth capacitor coupled between the first voltage potential and the second voltage potential.

15. A semiconductor chip comprising:
a protection structure having:
a first transistor comprising:
a first collector formed in a first semiconductor region;
a first emitter formed in a second semiconductor region; and
a first base formed in a substrate;
a second transistor comprising:
a second collector formed in a third semiconductor region;
a second emitter formed in a fourth semiconductor region; and
a second base formed in the substrate and coupled to the first base;
a third capacitor coupled between a first voltage potential and a second voltage potential; and
a fourth capacitor coupled between the first voltage potential and the second voltage potential;
a low dropout regulator having:
a first pad electrically coupled to the first collector of the first transistor and the second collector of the second transistor; and
a second pad electrically coupled to the first emitter of the first transistor and the second emitter of the second transistor.

16. The semiconductor chip of claim 15, wherein:
the first base is coupled to a first capacitor and a second capacitor, wherein:
the first capacitor is coupled between the base and the first voltage potential; and
the second capacitor is coupled between the base and the second voltage potential.

17. The semiconductor chip of claim 15, wherein:
the protection structure and the low dropout regulator are formed in a same semiconductor die.

18. The semiconductor chip of claim 15, wherein:
the protection structure and the low dropout regulator are formed in different semiconductor dies.

19. The semiconductor chip of claim 15, wherein:
the first voltage potential is an output of a band gap reference circuit; and
the second voltage potential is ground.

20. The semiconductor chip of claim 15, wherein:
the first semiconductor region, the second semiconductor region, the third semiconductor region and the fourth semiconductor region are n-type regions formed in a p-type substrate.

\* \* \* \* \*